(12) United States Patent
Mueller et al.

(10) Patent No.: US 12,105,429 B2
(45) Date of Patent: Oct. 1, 2024

(54) OPTICAL SYSTEM WITH AN APERTURE STOP

(71) Applicant: Carl Zeiss SMT GmbH, Oberkochen (DE)

(72) Inventors: Tanja Mueller, Heidenheim (DE); Rudi Littelink, Bathmen (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 35 days.

(21) Appl. No.: 18/068,674

(22) Filed: Dec. 20, 2022

(65) Prior Publication Data

US 2023/0123115 A1 Apr. 20, 2023

Related U.S. Application Data

(63) Continuation of application No. PCT/EP2021/065203, filed on Jun. 8, 2021.

(30) Foreign Application Priority Data

Jun. 29, 2020 (DE) .......................... 102020208007.0

(51) Int. Cl.
*G03F 7/00* (2006.01)

(52) U.S. Cl.
CPC ........ *G03F 7/7025* (2013.01); *G03F 7/70225* (2013.01); *G03F 7/70233* (2013.01); *G03F 7/70891* (2013.01); *G03F 7/70958* (2013.01)

(58) Field of Classification Search
CPC ............. G03F 7/70225; G03F 7/70233; G03F 7/7025; G03F 7/70891; G03F 7/70958; G02B 5/005; G02B 7/008
See application file for complete search history.

(56) References Cited

U.S. PATENT DOCUMENTS

| 5,311,249 | A  | * | 5/1994 | Kamon ................... G03F 7/701 355/71 |
| 2005/0024619 | A1 | * | 2/2005 | Shinoda ................. G03B 27/72 355/71 |
| 2007/0046905 | A1 | * | 3/2007 | Takeuchi ................. G03B 9/06 353/97 |

(Continued)

FOREIGN PATENT DOCUMENTS

| DE | 102015201253 A1 | 3/2015 |
| DE | 102017200419 A1 | 3/2017 |
| DE | 102016221823 A1 | 9/2017 |

(Continued)

OTHER PUBLICATIONS

German Office Action, with translation thereof, for corresponding DE Appl No. 10 2020 208 007.0, dated Jan. 22, 2021.

(Continued)

*Primary Examiner* — Deoram Persaud
(74) *Attorney, Agent, or Firm* — Fish & Richardson P.C.

(57) ABSTRACT

The disclosure relates to an optical system, for example a lithography system, comprising an aperture stop having an aperture with an edge for delimiting a beam path of the optical system on its outer circumference. The optical system also includes a heat stop arranged upstream of the aperture stop for partially shading the aperture stop. The edge of the aperture stop is excluded from the shading.

20 Claims, 3 Drawing Sheets

(56) References Cited

U.S. PATENT DOCUMENTS

2023/0194994 A1* 6/2023 Mueller .................. G02B 7/00
355/67

FOREIGN PATENT DOCUMENTS

| DE | 102016216917 A1 | 3/2018 |
| DE | 102017219266 A1 | 5/2018 |
| DE | 102019209265 A1 | 10/2019 |
| WO | WO2006/069725 A1 | 7/2006 |
| WO | WO2008/034582 A1 | 3/2008 |
| WO | WO2018/046350 A1 | 3/2018 |

OTHER PUBLICATIONS

Translation of International Preliminary Report on Patentability for corresponding PCT Appl No. PCT/EP2021/065203, dated Jan. 12, 2023.
Translation of International Search Report for corresponding PCT Appl No. PCT/EP2021/065203, dated Oct. 1, 2021.

* cited by examiner

OPTICAL SYSTEM WITH AN APERTURE STOP

CROSS-REFERENCE TO RELATED APPLICATIONS

The present application is a continuation of, and claims benefit under 35 USC 120 to, international application PCT/EP2021/065203, filed Jun. 8, 2021, which claims benefit under 35 USC 119 of German Application No. 10 2020 208 007.0, filed Jun. 29, 2020. The entire disclosure of these applications are incorporated by reference herein.

FIELD

The disclosure relates to an optical system, such as a lithography system, comprising an aperture stop having an aperture with an edge for delimiting a beam path of the optical system on its outer circumference.

BACKGROUND

A lithography system can be a lithography apparatus for exposing a wafer or another microlithographic optical system, for example an inspection system, e.g. a system for measuring or inspecting lithographic masks, wafers or the like. The lithography system can, for example, be an EUV lithography apparatus or a DUV lithography apparatus. EUV stands for "extreme ultraviolet" and describes a wavelength of used radiation of between 0.1 nm and 30 nm. DUV stands for "deep ultraviolet" and describes a wavelength of used radiation of between 30 nm and 250 nm.

The numerical aperture is a parameter of lithography systems, especially of lithography apparatuses. In lithography systems, the numerical aperture can be set or modified with the aid of so-called aperture stops. An aperture stop is understood to be a stop that (sharply) delimits the beam path on its outer circumference. For this purpose, the aperture stop has an aperture with a (circumferential) edge. The geometry of the aperture or the edge defines here the geometry of the outer circumference of the cross section of the beam path or of the beam of rays passing through the aperture of the aperture stop.

In addition to aperture stops, so-called obscuration stops can also be used in optical systems. These stops are arranged within the beam path of the optical system and block out an inner partial region of the beam path or of the beam cross section. It is known to hold obscuration stops in the center of the beam path with the aid of thin bars or in a different way. Due to the radiation, which is incident on the obscuration stop, heat is introduced into it. The corresponding thermal load can be dissipated only via the thin bars. Accordingly, the obscuration stops heat up more than aperture stops. During the exposure operation of lithography apparatuses, obscuration stops can therefore heat up to temperatures of more than approx. 120° C. or 190° C., while the temperature of aperture stops is up to approx. 30-40° C.

The high temperature of obscuration stops can result in relevant thermal expansion thereof and/or of the bars that are used to attach the obscuration stop to a holder. The thermal expansion in the bars can lead to radial stress, which can lead to the obscuration stop deflecting in the direction of the beam path or transversely to the beam path. This can change in the optical parameters of the lithography apparatus, for example in its telecentricity.

DE 10 2015 201 253 A1 describes a projection exposure apparatus with an obscuration stop, which has an outer stop ring and an inner stop located inside the stop ring for blocking out an inner region of a work laser beam. In one exemplary embodiment, the inner stop has a cooling device which is configured in such a way that a defined heat reduction in the inner stop is made possible. In another exemplary embodiment, the inner stop has a mirror surface for reflecting the work light.

DE 10 2016 221 823 A1 describes an optical system with an obscuration stop and with a holder. In one exemplary embodiment, a decoupling device is provided, which is set up to decouple thermal expansion of the obscuration stop from the holder. In a further exemplary embodiment, a heat stop is arranged upstream of the obscuration stop in the direction of light in the beam path and is set up to partially shade the obscuration stop, wherein the light-determining edge of the obscuration stop is excluded from the shading.

SUMMARY

The disclosure seeks to provide an optical system, such as a lithography system, whose optical parameters, for example numerical aperture, change as little as possible during operation.

The disclosure provides an optical system in which a heat stop is arranged upstream of the aperture stop—outside the beam path—for partially shading the aperture stop, wherein the edge of the aperture stop is excluded from the shading.

The inventors have recognized that it is not only the (greater) thermal load that is incident on the obscuration stop which may be present, but also the thermal load that is incident on the aperture stop that can have a strong influence on the optical parameters of the optical system. This influence is due to the fact that, under the usually considerable thermal load caused by the absorption of the radiation to be blocked out during operation of the optical system, which can be several watts, for example, the material of the aperture stop can heat up so much that it thermally expands. The thermal expansion of the aperture stop can cause the edge of the aperture stop to shift from its nominal position. As a result, the specifications for the position tolerance of the aperture stop might not be observed, which can lead to a significant change in the numerical aperture during operation of the optical system.

In the event that the aperture stop is arranged in the projection system of a lithography system, an operator of the lithography system can adapt the illumination settings to the respective application, so that the thermal load that is incident on the aperture stop might not be readily predicted. It therefore might not possible to adapt the dimensioning of the aperture to the expected thermal load. It is also possible to dissipate the thermal load via a holder for the aperture stop, but the aperture stop cannot usually be cooled well, since it is only indirectly connected to a cooling device, which, for example, is used in an EUV lithography apparatus to cool a so-called "mini environment" (see below).

The disclosure therefore proposes to use a further stop, which is also referred to as a heat stop, to reduce the thermal load on the aperture stop. The heat stop can serve as a shield for the aperture stop and is located upstream of the aperture stop (outside the beam path). An arrangement outside the beam path is understood to mean that the aperture of the heat stop, more specifically the edge of the aperture, does not peripherally delimit the beam path along its outer circumference, i.e. the heat stop does not have a light-delimiting edge. The heat stop thus does not perform the task of the aperture stop of peripherally cropping the beam path, but serves merely to prevent the thermal expansion of the aperture stop as far as possible, so that the tolerance specification with regard to the position of the aperture stop can be observed. In this way, tighter positioning tolerances of the aperture stop can be observed than would be the case without the presence of the heat stop.

In one embodiment, the heat stop has an aperture with an edge spaced apart from the outer circumference of the beam path. As described further above, it is desirable for the heat stop to not perform the task of the actual aperture stop of peripherally delimiting the beam path. To prevent the edge of the heat stop from being a light-delimiting edge during the thermal expansion, the edge of the heat stop can have a safety distance from the outer circumference of the beam path.

In one further development, the edge of the aperture of the heat stop is located at a (minimum) distance of at least 50 µm, such as at least 1 µm, from the outer circumference of the beam path when the optical system is in operation. The cross-sectional area of the aperture of the heat stop is larger than the cross-sectional area of the beam path at the location of the heat stop by a specified amount, i.e. a gap is formed between the outer circumference of the beam path and the edge of the aperture of the heat stop. The distance or the size of the gap is dimensioned, in general, in such a way that the heat stop does not expand so far that the edge of the aperture of the heat stop reaches the outer circumference of the beam path, even under the maximum thermal load impinging on it and thus at its maximum operating temperature.

In order to achieve this, it can be desirable for every point of the edge of the aperture at its maximum operating temperature in the optical system (including tolerances, e.g. due to production, position, . . . ) to be arranged at least 1 µm, such as at least 50 µm, away from the beam path. In this way, a change in shape of the heat stop can be prevented from influencing the beam path or the used light volume in any way before the light beam is incident on the aperture stop. This can help ensure that the heat stop does not perform the role of the aperture stop.

The expansion of the heat stop typically depends not only on the maximum thermal load but also on the coefficient of thermal expansion of the heat stop material. For example, if the material of the heat stop is Invar, which has a low coefficient of thermal expansion, the heat stop can be mounted in the optical system at a shorter distance from the beam path than is the case with a material with a larger coefficient of thermal expansion. The distance between the edge of the aperture when mounted (at room temperature (22° C.)) can be selected here depending on the coefficient of thermal expansion of the material of the heat stop such that, when the optical system is in operation at the maximum operating temperature of typically approx. 40° C. of the heat stop, the above condition for the distance is met.

When the optical system is in operation, the edge of the aperture can have a (maximum) distance of no more than 2 mm, such as no more than 1 mm, from the outer circumference of the beam path. In general, the greater the distance between the edge of the aperture of the heat stop and the outer circumference of the beam path, the less the aperture stop is shaded by the heat stop. The distance between the edge of the aperture and the outer periphery of the beam path when the optical system is in operation can therefore be selected such that it is not too large. In this way, it can be possible for as much radiation as possible to be absorbed by the heat stop and can no longer reach the aperture stop.

In the event that the cross section of the beam path between the heat stop and the aperture stop changes only slightly, the values given above with regard to the distance from the outer circumference of the beam path apply correspondingly to the distance from the outer circumference of the aperture of the aperture stop, i.e. when the optical system is operating at maximum thermal load, the edge of the aperture of the heat stop has, when projected into a plane perpendicular to the optical axis of the optical system, a distance of at least 50 µm or at least 1 µm from the edge of the aperture of the aperture stop when projected into the same plane.

In a further embodiment, the geometric shape of the aperture of the heat stop matches the geometric shape of the aperture or the aperture stop. Geometric shapes are, as is generally customary, understood to mean circular, oval, elliptical, rectangular, square, polygonal, . . . shapes, but also free forms. A matching geometric shape is understood to mean, for example, that the aperture or the edge of the aperture of the aperture stop and of the heat stop have oval or elliptical shapes or free forms that match regarding their geometries (possibly apart from scaling, see below). The dimensions of the respective geometric shape or of the aperture are generally larger in the case of the heat stop than in the case of the aperture stop. The same geometric shape is also understood to mean that the two apertures may be scaled differently in two mutually perpendicular directions, for example if the ratio of the lengths of the principal axes of an aperture with oval or elliptical geometry of the heat stop and of the aperture stop differ from one another. This is typically the case when the aperture stop and the heat stop are not oriented parallel, but at an angle to each other (see below). In the event that the aperture stop and the heat stop are oriented at an angle to one another, the projection of the aperture of the heat stop into the plane of the aperture stop is used for the comparison of the geometric shape of the aperture of the heat stop with the geometric shape of the aperture of the aperture stop.

In one embodiment, the heat stop is oriented at an angle other than 0° to the aperture stop. The angle is typically greater than 1°, such as greater than 3°, for example greater than 5°. For example, the angle can be between approx. 8° and approx. 20°. While the aperture stop is usually arranged in or in the vicinity of a defined plane (pupil plane), this is not necessary with the heat stop, since it does not perform any optical function. It may be convenient to arrange the heat stop in a defined orientation, e.g., in a horizontal plane, while the aperture stop is tilted, i.e. oriented at an angle, with respect to that plane. The possibility of being able to orient the heat stop just about in any way in space can be utilized for example for simplifying the cooling of the heat stop. Also, when orienting the aperture stop at an angle to the heat stop, the available installation space may possibly be better used.

The orientation of the heat stop in a horizontal plane, for example, can also be used to use the heat stop as a reference surface for a stop module into which the aperture stop and other stops, e.g. an obscuration stop or an obscuration stop frame, are integrated and in which the aperture stop is positioned. The heat stop can be fixed or positioned in its lateral position by end stops at a suitable interface. The stop module can be held in a desired position relative to the beam path within the optical system with the aid of spacers, but this is not absolutely necessary.

In an embodiment, the optical system comprises an obscuration stop for blocking out an inner partial region of the beam path. As described further above, the obscuration stop is designed to block out or shade an inner partial region of the cross section of the beam path. The obscuration stop is typically used in order to cover an obscuration, for example an opening in a mirror or the like, through which the beam path of the optical system leads. An obscuration or an obscured design can be used for example in projection systems or projection lenses for EUV lithography having a high numerical aperture. In a projection system with an obscured design, a small partial region of the exit pupil remains dark, but such a design makes it possible to realize significant advantages in terms of transmission. Projection systems with an obscured optical design, more specifically with an obscured pupil, are described, for example, in WO2006/069725 A1, which is incorporated into this application in its entirety by reference.

The aperture stop can serve as a holder for the obscuration stop, as is described, for example, in DE 10 2016 221 823 A1, which is incorporated into this application in its entirety by reference.

In a development, the obscuration stop is arranged in the beam path between the aperture stop and the heat stop. In this case, the obscuration stop is typically arranged at a small distance from the aperture stop and is generally oriented substantially parallel to the aperture stop. This can be expedient since both the aperture stop and the obscuration stop are typically arranged in or in the vicinity of a pupil plane in the optical system. In this case, the aperture stop does not serve as a holder for the obscuration stop, which is attached to its own holder, for example, via bars or the like. The holder can be a support frame of the optical system or a stop module, to which the aperture stop is typically also attached.

In an embodiment, the optical system comprises a holder for holding the obscuration stop in the beam path, and optionally a decoupling device which is designed to decouple thermal expansion of the obscuration stop from the holder. The obscuration stop forms a stop element, which is attached to the holder, for example, via webs. As described in DE 10 2016 221 823 A1 cited in the introductory part, the optical system can have a decoupling device in order to decouple the thermal expansion of the obscuration stop from the holder. For this purpose, the decoupling device can have, for example, one or more springs, which are arranged, for example, between the obscuration stop and the holder, or between a respective bar and the holder. The holder for the obscuration stop can be a support frame of the optical system, to which the aperture stop is typically also attached, or a component which is connected to the support frame, e.g. a stop module.

Due to the typically small distance between the aperture stop and the obscuration stop, heating of the aperture stop can lead to the emission of thermal radiation and therefore to a potentially significant input of heat into the obscuration stop. The thermal load on the aperture stop can be reduced by the heat stop described above, so that less thermal radiation from the aperture stop reaches the obscuration stop and its thermal load is also reduced.

In an embodiment, the optical system has at least one beam trap for absorbing radiation reflected at the obscuration stop. As has been described further above, part of the radiation that is incident on the obscuration stop is generally reflected at the obscuration stop. In order to catch the reflected radiation, more specifically to absorb it, the optical system can have (at least) one beam trap, which has a radiation-absorbing material or consists of such a material. Optionally, the radiation reflected at the obscuration stop can pass through the aperture of the heat stop before it is incident on the beam trap, since this provides more freedom for the arrangement of the beam trap in the optical system. In order to ensure that the radiation reflected back at the obscuration stop passes completely through the aperture of the heat stop, the obscuration stop—and thus also the aperture stop, which is typically oriented parallel to it—can be oriented at an angle to one another.

The beam trap can, for example, be mounted on the inside of a vacuum housing of the optical system (see below), which can be temperature-controlled, for example cooled, with the aid of a temperature control device.

In a embodiment, the optical system comprises a temperature control device, for example a cooling device, for controlling the temperature of, for example for cooling, the heat stop. Since the heat stop carries most of the thermal load that would otherwise be incident on the aperture stop, it is possible that the thermal load can be quickly and easily dissipated by the heat stop. This can help ensure that the thermal expansion of the edge or the contour of the heat stop is not too great during the heating during operation of the optical system, as a result of which the edge of the aperture of the heat stop can be arranged closer to the outer circumference of the beam path. Accordingly, the thermal load incident on the aperture stop can be reduced since a larger proportion of the thermal load is absorbed by the heat stop.

The temperature control device can be designed for direct cooling of the heat stop or for indirect cooling of the heat stop, e.g. by cooling a holder of the heat stop. The temperature control device can also be used to heat the heat stop. The temperature control device can comprise, for example, a Peltier element for heating and/or for cooling or fluid and/or gas cooling. In the case of fluid cooling, for example the heat stop itself, a holder for the heat stop or another component that can be in extensive contact with the heat stop or the holder can be cooled with the aid of a cooling fluid, for example with the aid of cooling water. It is also possible to heat the heat stop in this way.

In a development, the heat stop is in contact with a surface of a vacuum housing of the optical system, and the temperature control device is designed for controlling the temperature of, for example for cooling, the vacuum housing. Due to the possible extensive contact of the surface of the vacuum housing with the heat stop, which is typically a substantially plate-shaped component, efficient temperature control, for example efficient cooling, of the heat stop can take place.

The vacuum housing can for example be a housing which delimits a so-called "mini-environment" in which at least one optical element is arranged, as is described, for example, in WO2008/034582 A1, which is incorporated into this application in its entirety by reference. The temperature control device can be configured as a cooling device in order to cool the vacuum housing, e.g. via fluid cooling, for example via water cooling. For this purpose, cooling channels can be provided in the vacuum housing or in a component that is in contact with the vacuum housing.

In a embodiment, the aperture stop and/or the heat stop is/are formed from a metallic material which can be selected from the group comprising: aluminum, copper and steel. The aperture stop, the heat stop and/or the obscuration stop that may be present can be shaped like a plate and made of a metallic material, for example a metal sheet. The use of metallic materials, for example aluminum or copper, which have a high thermal conductivity, has proven to be advantageous for cooling the stops. However, even if aluminum or copper is used as the stop material of the aperture stop, the positional deviation caused by the thermal expansion can be significant without the use of the heat stop.

In an embodiment, the optical system comprises a projection system for imaging a reticle onto a wafer, wherein the aperture stop is arranged in the region of a pupil plane of the projection system. In this case, the optical system is configured as a lithography apparatus and has a beam shaping and illumination system in addition to the projection system. The illumination settings of the beam shaping and illumination system can be changed depending on the structure to be imaged on the mask, which has an effect on the radiant power and the thermal load at the aperture stop. As described above, the obscuration stop—if it is desired—can also be arranged in or in the immediate vicinity of the pupil plane.

Further features and aspects of the disclosure are evident from the following description of exemplary embodiments of the disclosure, with reference to the figures of the drawing, which show certain details to the disclosure, and from the claims. The individual features can each be implemented individually or together in any combination in a variant of the disclosure.

BRIEF DESCRIPTION OF THE DRAWINGS

Exemplary embodiments are shown in the schematic drawing and are explained in the following description. In the figures.

DETAILED DESCRIPTION

In the following description of the drawings, identical reference symbols are used for identical or functionally identical components.

Figure 1A:
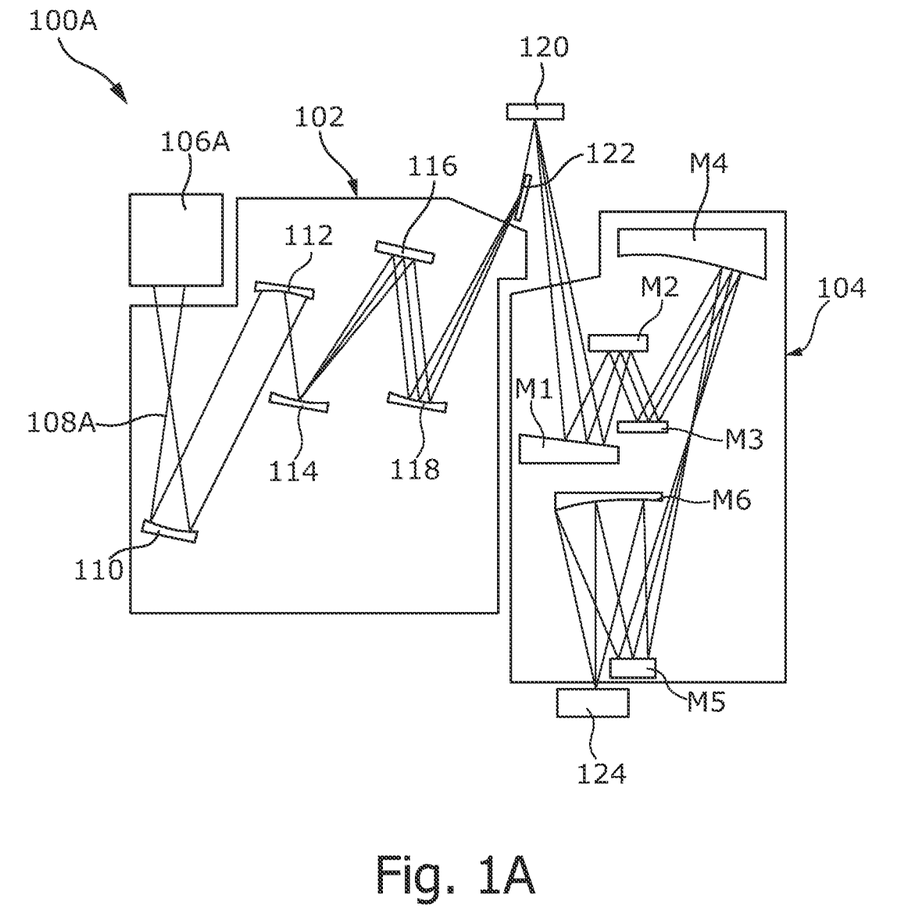
FIG. 1A shows a schematic illustration of an EUV lithography apparatus.

FIG. 1A shows schematically the construction of an EUV lithography apparatus 100A, which comprises a beam shaping and Illumination system 102 and a projection system 104. The beam shaping and illumination system 102 and the projection system 104 are each provided in a vacuum housing indicated in FIG. 1A, with each vacuum housing being evacuated with the aid of an evacuation device (not shown). The vacuum housings are surrounded by a machine room (not shown), in which the drive devices for mechanically shifting or setting the optical elements are provided. Furthermore, electrical controls and the like can also be provided in this machine room.

The EUV lithography apparatus 100A has an EUV light source 106A. A plasma source (or a synchrotron) can be provided as the EUV light source 106A, for example, which emits radiation 108A in the EUV range, e.g. in the wavelength range between 5 nm and 20 nm. The EUV radiation 108A is focused in the beam shaping and illumination system 102, and the desired operating wavelength is filtered out of the EUV radiation 108A. The EUV radiation 108A generated by the EUV light source 106A has a relatively low transmissivity through air, which is why the beam guidance spaces in the beam shaping and illumination system 102 and in the projection system 104 are evacuated.

The beam shaping and illumination system 102 shown in FIG. 1A has five mirrors 110, 112, 114, 116, 118. After passing through the beam shaping and illumination system 102, the EUV radiation 108A is directed onto the reticle 120. The reticle 120 is likewise configured as a reflective optical element and can be arranged outside of the systems 102, 104. Furthermore, the EUV radiation 108A can be directed onto the reticle 120 via a mirror 122. The reticle 120 has a structure which is imaged on a wafer 124 or the like in reduced form via the projection system 104.

The projection system 104 (also referred to as a projection lens) has six mirrors M1-M6 for imaging the reticle 120 onto the wafer 124. It should be noted that the number of mirrors of the EUV lithography apparatus 100A is not limited to the number shown.

More or fewer mirrors can also be provided. Furthermore, the mirrors are generally curved on their front side for beam shaping purposes.

Figure 1B:
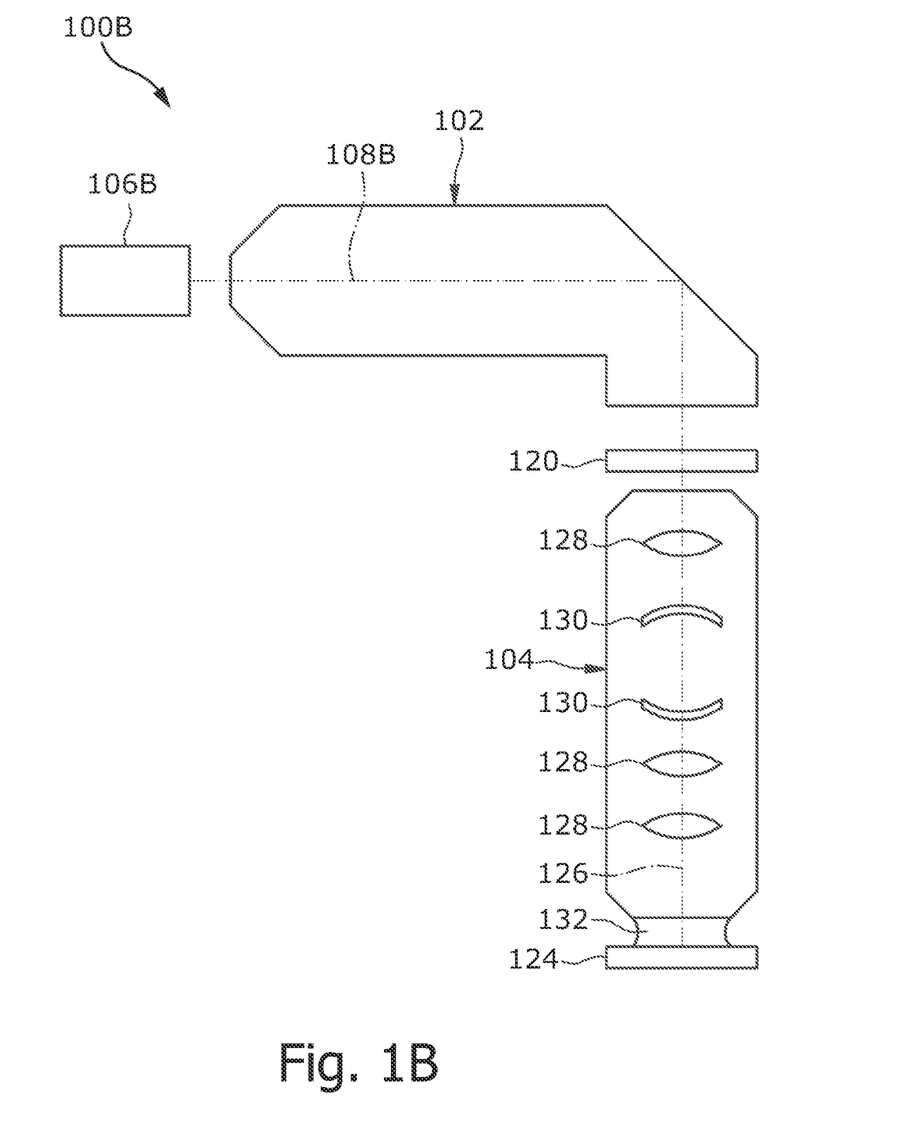
FIG. 1B shows a schematic illustration of a DUV lithography apparatus.

FIG. 1B shows a schematic view of a DUV lithography apparatus 100B, which includes a beam shaping and illumination system 102 and a projection system 104. The beam shaping and illumination system 102 and the projection system 104 can—as already described with reference to FIG. 1A—be arranged in a vacuum housing and/or surrounded by a machine room with corresponding drive devices.

The DUV lithography apparatus 100B has a DUV light source 106B. An ArF excimer laser, for example, can be provided as the DUV light source 106B, which emits radiation 108B in the DUV range at, for example, 193 nm.

The beam shaping and illumination system 102 shown in FIG. 1B directs the DUV radiation 108B onto a reticle 120. The reticle 120 is configured as a transmissive optical element and can be arranged outside of the systems 102, 104. The reticle 120 has a structure which is imaged on a wafer 124 or the like in reduced form via of the projection system 104.

The projection system 104 has a plurality of lens elements 128 and/or mirrors 130 for imaging the reticle 120 onto the wafer 124. In this case, individual lens elements 128 and/or mirrors 130 of the projection system 104 can be arranged symmetrically to the optical axis 126 of the projection system 104. It should be noted that the number of lens elements and mirrors of the DUV lithography apparatus 100B is not limited to the number shown. More or fewer lens elements and/or mirrors can also be provided. Furthermore, the mirrors are generally curved on their front side for beam shaping purposes.

An air gap between the last lens element 128 and the wafer 124 can be replaced by a liquid medium 132 having a refractive index>1. The liquid medium can be, for example, high-purity water. Such a construction is also referred to as immersion lithography and has an increased resolution when imaging the reticle 120 onto the wafer 124.

Figure 2:
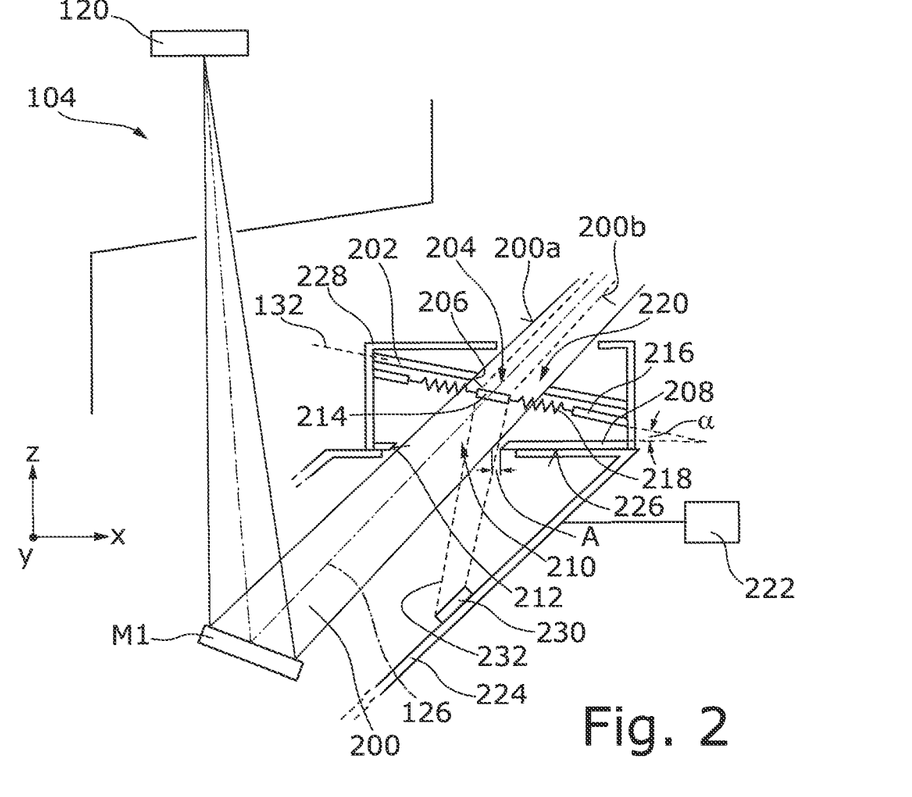
FIG. 2 shows a schematic illustration of an aperture stop for delimiting an outer circumference of a beam path of the EUV lithography system from FIG. 1 and a heat stop for partial shading of the aperture stop.

FIG. 2 shows a detail of the EUV lithography apparatus 100A of FIG. 1A, more specifically of the projection system 104. The first mirror M1, which is shown in FIG. 2, and the second mirror M2 (cf. FIG. 1A) define a section of the beam path 200 of the projection system 104 or of the EUV lithography apparatus 100A. An aperture stop 202 is arranged between the first mirror M1 and the second mirror M2, which aperture stop has an aperture 204 with a surrounding edge 206 for delimiting the beam path 200 of the EUV lithography apparatus 100A at its outer circumference 200a. The aperture stop 202 is used to peripherally crop or precisely define the beam path 200 in order to define the (entry-side) numerical aperture of the projection system 104.

A proportion of the EUV radiation 108A of the EUV lithography apparatus which is incident on a region of the aperture stop 202 adjoining the edge 206 is absorbed by the material of the aperture stop 202, as a result of which the latter heats up. The aperture stop 202 is plate-shaped in the example shown in FIG. 2 and consists of a metallic material, i.e. it is a metal sheet. For example, metallic materials with a high coefficient of thermal conductivity, e.g. aluminum, copper or steel, have proven to be advantageous as materials for the aperture stop 202 (and also for the heat stop 208 (see below)), since this enables direct cooling.

It has been shown that the aperture stop 202, despite the fact that it is formed from a material with a high coefficient of thermal conductivity, may heat up considerably during operation of the EUV lithography apparatus 100A, since it is exposed to a thermal load of possibly several watts so that it heats up to temperatures of more than approx. 30-40° C. As a result of the heating of the aperture stop 202 during operation of the EUV lithography apparatus 100A, it can expand (possibly inhomogeneously), which may result in incorrect positioning of the aperture 204 relative to the beam path 200 and/or in a change in the geometry, for example a reduction in the size of the aperture 204. This leads to optical errors when imaging the reticle 120 onto the wafer 124.

In order to reduce the thermal load on the aperture stop 202, a heat stop 208 is arranged upstream of the aperture stop 202 in the beam path of the EUV radiation 108A. The heat stop 208 serves to partially shade the aperture stop 202 with respect to the EUV radiation 108A, wherein the edge 206 of the aperture stop 202 is excluded from the shading. This helps to ensure that only the aperture stop 202 and not the heat stop 208 performs the function of defining the numerical aperture of the projection system 104. To accomplish this, the heat stop 208 has an aperture 210 with an edge 212 spaced apart from the outer circumference 200a of the beam path 200.

The heat stop 208 is impinged upon by EUV radiation 108A, which propagates within the projection system 104 but outside of the beam path 200 and which therefore does not contribute to the imaging. The EUV radiation 108A that is incident on the heat stop 208 can also have been scattered at components of the EUV lithography apparatus 100A outside of the beam path 200. As can be seen in FIG. 2, the heat stop 208 is arranged entirely outside of the beam path 200 of the used radiation, that is to say of that radiation that contributes to the imaging of the reticle 120 onto the wafer 124. However, the heat stop 208 is impinged upon by what is known as extraneous light, which does not reach the wafer 124 and is absorbed by the heat stop 208.

In the example shown in FIG. 2, the edge 212 of the aperture 210 of the heat stop 208 has a (minimum) distance A of at least 50 µm, for example of at least 1 µm, from the outer circumference of the beam path 200a during the operation of the EUV lithography apparatus 100A at its maximum possible operating temperature of approx. 40° C., for example. The distance A of the edge 212 of the aperture 210 is dimensioned to be so large that the heat stop 208, even under the maximum thermal load to be expected, does not expand so much that the edge 212 of the heat stop 208 reaches the outer circumference 200a of the beam path 200, while also being dimensioned to be so small that the aperture stop 202 experiences the greatest possible shading by the heat stop 208. The distance A between the edge 212 of the aperture 210 of the heat stop 208 and the outer circumference 200a of the beam path 200 does not have to be constant; rather, the distance A can vary in the circumferential direction of the edge 212. Typical values for the distance A between the edge 212 of the heat stop 208 and the outer circumference 200a of the beam path 200 in the plane of the heat stop 208 lie between approx. 1 µm and approx. 2 mm, for example between approx. 50 µm and approx. 1 mm.

In the example shown in FIG. 2, the aperture stop 202 is arranged in or in the immediate vicinity of a pupil plane 132 of the beam path 200 of the projection system 104. This arrangement involves the aperture stop 202 to be inclined at an angle α to a horizontal plane that forms the XY-plane of an XYZ coordinate system. In contrast to the aperture stop 202, the heat stop 208 is oriented horizontally, i.e. parallel to the XY-plane. The angle α at which the aperture stop 202 is oriented to the heat stop 208 is generally more than 1°, more than 3° or more than 5°. Typical values for the angle α between the aperture stop 202 and the heat stop 208 are between approx. 8° and approx. 20°, wherein the size of the angle α depends among other things on the design of the projection system 104.

Figure 3A:
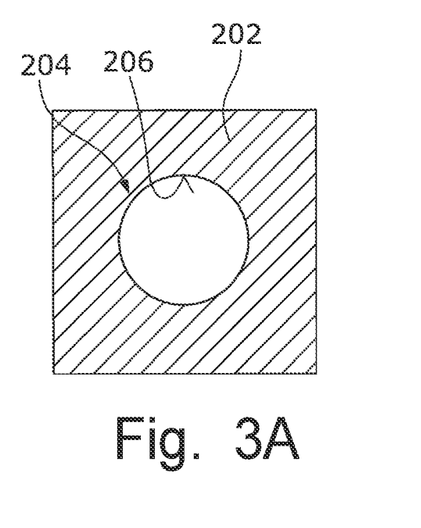
FIGS. 3A, 3B show schematic illustrations of a plan view of the aperture stop or of the aperture stop with the heat stop placed in front.
Figure 3B:
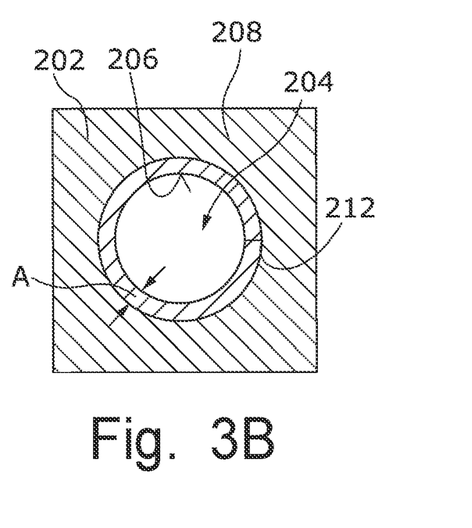

FIG. 3A shows a plan view of the aperture stop 202 in the direction of the optical axis 126 of the projection system 104 or the EUV lithography apparatus 100A from FIG. 1A. FIG. 3B shows a plan view of the aperture stop 202 and of the heat stop 208 in the direction of the optical axis 126 in the propagation direction of the EUV radiation 108A or along the optical axis 126. As can be seen in FIGS. 3A,b, both the aperture 204 of the aperture stop 202 and the—larger—aperture 210 of the heat stop 208 have an oval geometric shape. However, any other geometry—circular or non-circular—of the aperture 204 of the aperture stop 202, including a free-form geometry, is possible. The aperture 210 of the heat stop 208 is typically adapted or corresponds to the geometric shape of the aperture of the aperture stop 202.

As can be seen from FIG. 3B, the edge 206 of the aperture stop 202 in the projection along the optical axis 126 of the projection system 104 is spaced apart from the edge 212 of the heat stop 208 by a distance A which, as described further above, is at least 50 µm, for example at least 1 µm. The distance A or the width of the gap between the edge 206 of the aperture stop 208 and the edge 212 of the heat stop 208 in a plane perpendicular to the optical axis 126 lies between approx. 1 µm and 2 mm in the example shown, for example between approx. 50 µm and approx. 1 mm.

The projection system 104 comprises an obscuration (not shown), for example an opening in one of the mirrors M1 to M6, through which the beam path 200 of the projection system 104 leads. The obscuration is to be covered with the aid of an obscuration stop 214, for example in order to reduce a field dependency of a corresponding shading (in the plane of the wafer 124). The obscuration stop 214 is configured to cover or block out an inner partial region 200b of the beam path 200. This means that part of the EUV radiation 108A is reflected or absorbed by the obscuration stop 214 on its way through the beam path 200 from the first mirror M1 to the second mirror M2. The obscuration stop 214 is positioned entirely within the beam path 200 in or in the vicinity of the pupil plane 132, more specifically between the aperture stop 202 and the heat stop 208. The obscuration stop 214 may have a reflective coating (not shown) such that heat input into the obscuration stop 214 is reduced. In the example shown, the obscuration stop 214 is configured as an oval or elliptical plate and has an outer surrounding edge which serves as a light-determining edge for shading the inner partial region 200b of the beam path 200.

The projection system 104 also comprises a holder 216 that holds the obscuration stop 214 in the beam path 200. In the example shown, the holder 216 is attached to a stop module 228 of the projection system 104, more specifically to a side wall of the stop module 228. It is also possible that the holder 216 itself forms part of the stop module 228 or that the holder 216 is configured as a support frame of the projection system 104, which serves to hold the mirrors M1 to M6. The mirrors M1 to M6 can be held for example via actuators (for example weight force compensators and/or Lorentz actuators). As an alternative to the example shown in FIG. 2, the aperture stop 202 itself can serve as a holder for the obscuration stop 214.

In the example shown in FIG. 2, the obscuration stop 214 is attached to the holder 216 via bars 218. For thermally decoupling the thermal expansion of the obscuration stop 214 from the holder 216, the projection system 104 has a decoupling device 220 in the example shown. The decoupling device 220 is arranged between the holder 216 and the obscuration stop 214 and is configured as an elastically resilient bar 218 in the example shown. Other configurations of the decoupling device 220 are also possible, for example the decoupling device can comprise one or more springs which are mounted between a respective bar 218 and the holder 216, as is described in more detail, for example, in DE 10 2016 221 823 A1, which is cited in the introductory part.

As can be seen in FIG. 2, the aperture stop 202, the obscuration stop 214, and the heat stop 208 are housed in a common stop module 228, which itself is part of a vacuum housing (not depicted), which surrounds or encapsulates the (vacuum) environment of the second mirror M2 (see FIG. 1A). The stop module 228 is mounted on the top of a vacuum housing 224, shown in FIG. 2, which surrounds or encapsulates the first mirror M1.

The stop module 228, more specifically the heat stop 208, lies extensively with its underside against a surface 226 extending in the horizontal direction on the top of the vacuum housing 224 or against the vacuum housing 224. The vacuum housing 224 is temperature controlled, i.e. heated and/or cooled, with the aid of a temperature control device 222. In the example shown, the temperature control device is a cooling device that is configured for water cooling of the vacuum housing 224 in the example shown. For this purpose, cooling channels (not depicted) are attached in or to the vacuum housing 224. The extensive contact between the heat stop 208 and the vacuum housing 224 simplifies the cooling thereof. In order to be able to cool the heat stop 208 effectively, it is formed, like the aperture stop 202, from a metallic material which has a high thermal conductivity, for example from aluminum, copper or steel. Because of its horizontal orientation, the heat stop 208 is also suitable as a reference or initial position for spacers (not depicted) that hold the aperture stop 202 and the obscuration stop 214 within the stop module 228. It is also possible to provide a temperature control device 222 which makes it possible to selectively cool or heat the vacuum housing 224. For this purpose, the temperature control device 222 can be configured, for example, as a Peltier element or have at least one Peltier element.

As can likewise be seen in FIG. 2, a beam trap 230 ("beam dump") is mounted on the inside of the vacuum housing 224. The beam trap 230 serves to absorb EUV radiation 232 reflected at the obscuration stop 214. As can likewise be seen in FIG. 2, the reflected EUV radiation 232 passes through the aperture 210 of the heat stop 208 before it is incident on the beam trap 230 on the cooled vacuum housing 244 and is absorbed by the beam trap 230. In order to make it possible for the reflected EUV radiation 232 to pass through the opening 210 of the heat stop 208 and not be (partially) shaded by the heat stop 208, it is advantageous if the aperture stop 202 (and for example the obscuration stop 214 oriented parallel to the aperture stop 202) is oriented at an angle α to the heat stop 208, as is the case in the example shown in FIG. 2.

It goes without saying that the aperture stop 202 can be shaded with the aid of a heat stop 208 not only in the EUV lithography apparatus 100A described further above, but also in other optical systems, in order to reduce the thermal load. The optical system can for example be the DUV lithography apparatus 100B shown in FIG. 1B. The optical system can also be a microscope, for example an electron microscope. For example, the optical system can also be a section, i.e. an arrangement of a plurality of components, of the EUV lithography apparatus 100A from FIG. 1A or the DUV lithography apparatus 100B from FIG. 1B. It goes without saying that the aperture stop 202 does not necessarily have to be placed in the beam path 200 between two mirrors M1, M2, but that it can also be placed in the beam path between other optical elements, which are basically lens elements, retardation plates, optical gratings or the like.

What is claimed is:

1. An optical system, comprising:
    an aperture stop comprising a solid portion and an aperture with, the aperture having an edge configured to delimit an outer circumference of a beam path of used radiation in the optical system; and
    a heat stop upstream of the aperture stop along the beam path of the used radiation in the optical system,
    wherein:
        the heat stop comprises a solid portion and an aperture;
        the aperture of the heat stop has an edge;
        the solid portion of the heat stop is configured to partially shade the solid portion of the aperture stop from extraneous radiation in the optical system, the extraneous radiation propagating outside of the beam path of the used radiation in the optical system;
        the edge of the aperture stop is excluded from the shading of the extraneous radiation in the optical system;
        there is a space between the edge of the aperture of the heat stop and the outer circumference of the beam path of the used radiation in the optical system so that the used radiation does not impinge on the solid portion of the heat stop; and
        the edge of the aperture of the heat stop is at most two millimeters from the outer circumference of the beam path of the used radiation in the optical system.

2. The optical system of claim 1, wherein the space between the edge of the aperture of the heat stop of the outer circumference of the beam path of the used radiation in the optical system is at least 50 micrometers.

3. The optical system of claim 1, wherein the space between the edge of the aperture of the heat stop of the outer circumference of the beam path of the used radiation in the optical system is at least one micrometer.

4. The optical system of claim 3, wherein the space between the edge of the aperture of the heat stop and the outer circumference of the beam path of the used radiation in the optical system is at most one millimeter.

5. The optical system of claim 1, wherein the space between the edge of the aperture of the heat stop and the outer circumference of the beam path of the used radiation in the optical system is at most one millimeter.

6. The optical system of claim 1, wherein a geometric shape of the aperture of the heat stop corresponds to a geometric shape of the aperture of the aperture stop.

7. The optical system of claim 1, wherein the heat stop is oriented at an angle of other than 0° relative to the aperture stop.

8. The optical system of claim 1, wherein the heat stop is oriented at an angle of greater than 1° relative to the aperture stop.

9. The optical system of claim 1, further comprising an obscuration stop configured to block out an inner partial region of the beam path of the used radiation in the optical system.

10. The optical system of claim 9, wherein the obscuration stop is in the beam path of the used radiation in the optical system between the aperture stop and the heat stop.

11. The optical system of claim 10, further comprising a beam trap configured to absorb radiation reflected by the obscuration stop.

12. The optical system of claim 9, further comprising a beam trap configured to absorb radiation reflected by the obscuration stop.

13. The optical system of claim 9, further comprising a holder configured to hold the obscuration stop in the beam path of the used radiation in the optical system.

14. The optical system of claim 13, further comprising a decoupling device configured to decouple thermal expansion of the obscuration stop from the holder.

15. The optical system of claim 1, further comprising a temperature control device configured to control a temperature of the heat stop.

16. The optical system of claim 15, wherein the heat stop contacts a surface of a vacuum housing of the optical system, and the temperature control device is configured to control a temperature of the vacuum housing.

17. The optical system of claim 1, wherein at least one member selected from the group consisting of the aperture stop and the heat stop comprises a metallic material.

18. The optical system of claim 1, wherein at least one member selected from the group consisting of the aperture stop and the heat stop comprises at least one material selected from the group consisting of aluminum, copper and steel.

19. The optical system of claim 1, wherein the optical system comprises a lithography system.

20. The optical system of claim 1, wherein the lithography system comprises a projection system configured to image a reticle onto a wafer, and the aperture stop is in a region of a pupil plane of the projection system.

* * * * *

UNITED STATES PATENT AND TRADEMARK OFFICE
CERTIFICATE OF CORRECTION

| | | |
|---|---|---|
| PATENT NO. | : 12,105,429 B2 | |
| APPLICATION NO. | : 18/068674 | |
| DATED | : October 1, 2024 | |
| INVENTOR(S) | : Tanja Mueller and Rudi Littelink | |

It is certified that error appears in the above-identified patent and that said Letters Patent is hereby corrected as shown below:

In the Specification

Column 10, Line 23, delete "FIGS. 3A,b," insert -- FIGS. 3A, 3B, --.

In the Claims

Column 12, Claim 1, Line 24-25, delete "aper-ture with," insert -- aperture --.

Signed and Sealed this
Third Day of December, 2024

*Katherine Kelly Vidal*

Katherine Kelly Vidal
*Director of the United States Patent and Trademark Office*